(12) United States Patent
Zeng et al.

(10) Patent No.: US 10,908,465 B2
(45) Date of Patent: Feb. 2, 2021

(54) ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Peng Zeng, Beijing (CN); Yonggang Du, Beijing (CN); Zhangfei Gao, Beijing (CN); Guohua Xu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 87 days.

(21) Appl. No.: 16/097,538

(22) PCT Filed: Apr. 16, 2018

(86) PCT No.: PCT/CN2018/083182
§ 371 (c)(1),
(2) Date: Oct. 29, 2018

(87) PCT Pub. No.: WO2018/210083
PCT Pub. Date: Nov. 22, 2018

(65) Prior Publication Data
US 2019/0155113 A1    May 23, 2019

(30) Foreign Application Priority Data

May 16, 2017  (CN) .......................... 2017 1 0344166

(51) Int. Cl.
*G02F 1/1362* (2006.01)
*H01L 27/02* (2006.01)
(Continued)

(52) U.S. Cl.
CPC ...... *G02F 1/136204* (2013.01); *G02F 1/1368* (2013.01); *G02F 1/136286* (2013.01);
(Continued)

(58) Field of Classification Search
None
See application file for complete search history.

(56) References Cited

U.S. PATENT DOCUMENTS 5,521,728 A * 5/1996 Kodate ............. G02F 1/136209
349/42
5,521,783 A * 5/1996 Wolfe ................. H01L 27/0251
257/358
(Continued)

FOREIGN PATENT DOCUMENTS

CN    101566772 A    10/2009
CN    101726895 A    6/2010
(Continued)

OTHER PUBLICATIONS

International Search Report and Written Opinion of the International Searching Authority corresponding to International Patent Application No. PCT/CN2018/083182, dated Jun. 29, 2018. (14 pages with English translation).
(Continued)

*Primary Examiner* — David E Graybill
(74) *Attorney, Agent, or Firm* — Myers Bigel, P.A.

(57) ABSTRACT

An array substrate is provided, comprising a display area and a non-display area outside the display area. The non-display area is provided with a first transistor and a first conductive region electrically connected with the first transistor. A control terminal, and one of a source and a drain of the first transistor are both electrically connected to a data line in the display area, the other of the source and the drain of the first transistor is electrically connected to the first
(Continued)

conductive region. For this array substrate, the static electricity generated on the data line in the rubbing process can be led to the first conductive region through the first transistor, so as to prevent the static electricity from being transmitted to the display area, which could have destroyed the TFT device in the display area.

11 Claims, 2 Drawing Sheets

(51) Int. Cl.
    *H01L 27/12*           (2006.01)
    *H01L 29/786*         (2006.01)
    *G02F 1/1368*         (2006.01)

(52) U.S. Cl.
    CPC ........ *H01L 27/0296* (2013.01); *H01L 27/124* (2013.01); *H01L 27/1251* (2013.01); *H01L 29/78696* (2013.01); *G02F 2001/136295* (2013.01); *H01L 27/0266* (2013.01)

(56) References Cited

U.S. PATENT DOCUMENTS

| | | | | |
|---|---|---|---|---|
| 5,751,525 | A * | 5/1998 | Olney | G01R 31/002 361/111 |
| 5,811,857 | A * | 9/1998 | Assaderaghi | H01L 27/0251 257/355 |
| 6,175,394 | B1 * | 1/2001 | Wu | G02F 1/136204 257/360 |
| 6,756,834 | B1 * | 6/2004 | Tong | H01L 27/0251 327/309 |
| 6,759,866 | B2 * | 7/2004 | Mori | G01R 31/3004 324/762.02 |
| 6,812,528 | B2 * | 11/2004 | Uchida | G02F 1/136204 257/355 |
| 6,999,290 | B1 * | 2/2006 | Takikawa | H01L 27/0255 361/119 |
| 7,365,773 | B2 * | 4/2008 | Takayanagi | H01L 27/14643 250/208.1 |
| 7,372,495 | B2 * | 5/2008 | Takayanagi | H01L 27/14643 250/208.1 |
| 7,420,790 | B2 * | 9/2008 | Takikawa | H01L 27/0255 257/355 |
| 7,511,930 | B2 * | 3/2009 | Apfel | H02H 9/041 361/55 |
| 7,525,588 | B2 * | 4/2009 | Takayanagi | H01L 27/14643 250/208.1 |
| 7,804,669 | B2 * | 9/2010 | Worley | H01L 27/0266 361/111 |
| 7,880,791 | B2 * | 2/2011 | Takayanagi | H04N 5/35527 250/208.1 |
| 8,373,348 | B2 * | 2/2013 | Liu | H05B 45/37 315/209 R |
| 8,654,053 | B2 * | 2/2014 | Gao | G09G 3/3611 345/87 |
| 8,692,823 | B2 * | 4/2014 | Toyotaka | G09G 3/20 345/212 |
| 8,890,859 | B2 * | 11/2014 | Toyotaka | G09G 3/20 345/212 |
| 9,013,846 | B2 * | 4/2015 | Duan | G02F 1/136204 361/56 |
| 9,019,666 | B2 * | 4/2015 | Bourgeat | H01L 23/60 257/355 |
| 9,035,923 | B2 * | 5/2015 | Kimura | G09G 3/3648 345/204 |
| 9,054,519 | B2 * | 6/2015 | Kitchener | H02H 9/042 |
| 9,236,377 | B2 * | 1/2016 | Kimura | H01L 29/41733 |
| 9,418,989 | B2 * | 8/2016 | Kimura | H01L 27/1288 |
| 9,439,265 | B1 * | 9/2016 | Fan | G09G 3/3233 |
| 9,552,761 | B2 * | 1/2017 | Kimura | G09G 3/3677 |
| 2001/0050835 | A1 * | 12/2001 | Uchida | G02F 1/136204 361/111 |
| 2002/0101547 | A1 | 8/2002 | Lee et al. | |
| 2002/0175607 | A1 * | 11/2002 | Hofmann | H01J 9/241 313/309 |
| 2004/0195625 | A1 * | 10/2004 | Ichikawa | H01L 27/1203 257/347 |
| 2006/0022274 | A1 * | 2/2006 | Hasegawa | H01L 27/1203 257/358 |
| 2006/0145951 | A1 * | 7/2006 | Watanabe | G09G 3/20 345/55 |
| 2006/0187330 | A1 * | 8/2006 | Takayanagi | H01L 27/14643 348/308 |
| 2007/0096214 | A1 * | 5/2007 | Chen | H01L 27/0285 257/355 |
| 2007/0146564 | A1 | 6/2007 | Wu et al. | |
| 2007/0235809 | A1 * | 10/2007 | Hayano | H01L 27/0266 257/355 |
| 2008/0135846 | A1 * | 6/2008 | Shin | H01L 27/0248 257/59 |
| 2008/0218652 | A1 * | 9/2008 | Kim | G02F 1/136204 349/40 |
| 2008/0225133 | A1 * | 9/2008 | Takayanagi | H01L 27/14643 348/222.1 |
| 2008/0259009 | A1 * | 10/2008 | Gao | G02F 1/136204 345/87 |
| 2008/0259511 | A1 * | 10/2008 | Worley | H01L 27/0266 361/56 |
| 2008/0309649 | A1 * | 12/2008 | Kojima | G09G 3/3283 345/204 |
| 2008/0315934 | A1 * | 12/2008 | Engl | G06F 1/22 327/306 |
| 2009/0200455 | A1 * | 8/2009 | Takayanagi | H01L 27/14643 250/214.1 |
| 2009/0296011 | A1 * | 12/2009 | Yoon | H01L 27/0248 349/40 |
| 2010/0097538 | A1 * | 4/2010 | Ota | G02F 1/136204 349/48 |
| 2010/0182226 | A1 * | 7/2010 | Umezaki | G09G 3/3677 345/98 |
| 2010/0245304 | A1 * | 9/2010 | Umezaki | G09G 3/20 345/205 |
| 2010/0245307 | A1 * | 9/2010 | Kimura | G09G 3/3688 345/206 |
| 2011/0057190 | A1 * | 3/2011 | Kimura | H01L 27/1255 257/59 |
| 2011/0090184 | A1 * | 4/2011 | Yamazaki | H01L 29/7869 345/204 |
| 2011/0095290 | A1 * | 4/2011 | Koo | G02F 1/1345 257/48 |
| 2011/0285690 | A1 * | 11/2011 | Li | G09G 3/20 345/212 |
| 2012/0032942 | A1 * | 2/2012 | Toyotaka | G09G 3/20 345/212 |
| 2012/0062528 | A1 * | 3/2012 | Kimura | G09G 3/3648 345/204 |
| 2012/0086081 | A1 * | 4/2012 | Moriwaki | H01L 27/0255 257/355 |
| 2012/0224291 | A1 * | 9/2012 | Kitchener | H02H 9/042 361/111 |
| 2012/0292624 | A1 * | 11/2012 | Lv | H01L 27/0266 257/59 |
| 2013/0050173 | A1 * | 2/2013 | Koo | G02F 1/136204 345/212 |
| 2013/0127360 | A1 * | 5/2013 | Liu | H05B 45/46 315/210 |
| 2014/0126093 | A1 * | 5/2014 | Duan | G02F 1/136204 361/56 |
| 2014/0204073 | A1 * | 7/2014 | Toyotaka | G09G 3/20 345/212 |
| 2014/0306227 | A1 * | 10/2014 | Yu | H01L 27/0296 257/72 |
| 2015/0171116 | A1 * | 6/2015 | Okazaki | H01L 29/78696 257/43 |
| 2015/0185519 | A1 * | 7/2015 | Kimura | G02F 1/13306 349/46 |

(56) References Cited

U.S. PATENT DOCUMENTS

| | | | | |
|---|---|---|---|---|
| 2015/0243215 A1* | 8/2015 | Kim | ................... | G09G 3/3233 |
| | | | | 345/77 |
| 2015/0309380 A1* | 10/2015 | Xu | ..................... | G09G 3/3655 |
| | | | | 257/300 |
| 2015/0339971 A1* | 11/2015 | Kimura | ............... | G09G 3/2096 |
| | | | | 345/214 |
| 2016/0152843 A1* | 6/2016 | Hwang | .................. | C09D 7/70 |
| | | | | 349/12 |
| 2016/0351587 A1* | 12/2016 | Kimura | ............. | H01L 29/78696 |
| 2016/0358994 A1* | 12/2016 | Tamonoki | ............... | H01L 51/56 |
| 2017/0010704 A1* | 1/2017 | Chen | ...................... | G06F 3/041 |
| 2017/0047353 A1* | 2/2017 | Kimura | ............... | H01L 27/1251 |
| 2017/0102594 A1* | 4/2017 | Hu | ................... | G02F 1/136204 |
| 2017/0116942 A1* | 4/2017 | Kimura | ................ | G09G 3/2096 |
| 2017/0132965 A1* | 5/2017 | Hsu | .................... | H01L 27/3211 |
| 2019/0155113 A1* | 5/2019 | Zeng | ................. | H01L 27/1251 |

FOREIGN PATENT DOCUMENTS

| | | |
|---|---|---|
| CN | 102655145 | 9/2012 |
| CN | 102983134 | 3/2013 |
| CN | 103676370 | 3/2014 |
| CN | 106019735 A | 10/2016 |
| CN | 106950775 | 7/2017 |
| TW | 200727058 | 7/2007 |

OTHER PUBLICATIONS

Office Action and English language translation, CN Application No. 201710344166.9, dated Apr. 29, 2019, 14 pp.

\* cited by examiner

ARRAY SUBSTRATE AND DISPLAY DEVICE

APPLICATION CROSS REFERENCE TO RELATED APPLICATIONS

The present application is a 35 U.S.C. 371 national stage application of PCT International Application No. PCT/CN2018/083182, filed on Apr. 16, 2018, which claims the benefit of Chinese patent application No. 201710344166.9, filed on May 16, 2017, the contents of which are incorporated herein by reference in their entireties.

TECHNICAL FIELD

This disclosure relates to the field of display technology, particularly to an array substrate and a display device.

BACKGROUND

Thin film transistor liquid crystal display panels have been widely applied in apparatus such as mobile devices, notebook PC, liquid crystal televisions, and have become the mainstream in panel display.

Rubbing is an indispensable step in the process of manufacturing the thin film transistor liquid crystal display panel. During this process, the friction between the rubbing cloth and the glass substrate often produces static electricity. If the static electricity could not be released effectively, it will be accumulated on the glass substrate. Various undesirable phenomena involving the static electricity may occur if the static electricity exceeds a product tolerance threshold.

In particular, in case the static electricity generated in the rubbing process could not be released effectively, it can only be conducted to the display area of the display panel through data lines, breaking down the conducting channel of one or more thin film transistors in the display area, thereby resulting in defects finally, e.g., as shown in FIG. 1, bright spots or bright lines exist when the liquid crystal display panel performs displaying.

SUMMARY

An embodiment of the disclosure provides an array substrate comprising a display area and a non-display area outside the display area. The non-display area is provided with a first transistor and a first conductive region electrically connected with the first transistor. A control terminal, and one of a source and a drain of the first transistor are both electrically connected to a data line in the display area, the other of the source and the drain of the first transistor is electrically connected to the first conductive region.

In some embodiments, the first transistor is a first thin film transistor, the display area is provided with a second thin film transistor for image display, a threshold voltage of the first thin film transistor is higher than that of the second thin film transistor.

In some embodiments, a first current value for turning on the first thin film transistor is greater than or equal to a second current value for breaking down the second thin film transistor.

In some embodiments, a channel breadth length ratio of the first thin film transistor is smaller than that of the second thin film transistor.

In some embodiments, the non-display area surrounds the display area and the non-display area is provided with a plurality of the first transistors, which are electrically connected with a plurality of data lines in one-to-one correspondence respectively, a plurality of first conductive regions electrically connected with the plurality of first transistors are connected successively to form a conductive band around the display area.

In some embodiments, the data line extends from the display area to the non-display area, each data line is electrically connected with at least two first transistors, and the at least two first transistors are connected in parallel with each other, the at least two first transistors are arranged in the non-display area successively along an extending direction of the data line towards the non-display area.

In some embodiments, all first conductive regions electrically connected with respective first transistors are connected with each other.

In some embodiments, a material of the first conductive region includes ITO.

A further embodiment of the disclosure provides a display device, comprising the array substrate according to any one of the above embodiments.

DETAILED DESCRIPTION

In the following, technical solutions of embodiments of this disclosure will be described clearly and completely in conjunction with the drawings. The embodiments described herein are only a part, rather than all of the possible embodiments of the invention. Based on the embodiments herein, all other embodiments obtained by the ordinary skilled person in the art without any inventive effort belong to the scope of the present application.

Figure 1:
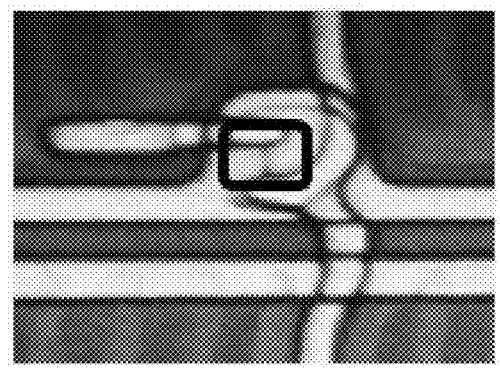
FIG. 1 is a view illustrating a phenomenon of displaying defects caused by breakdown of the conducting channel of the thin film transistor due to static electricity.
Figure 2:
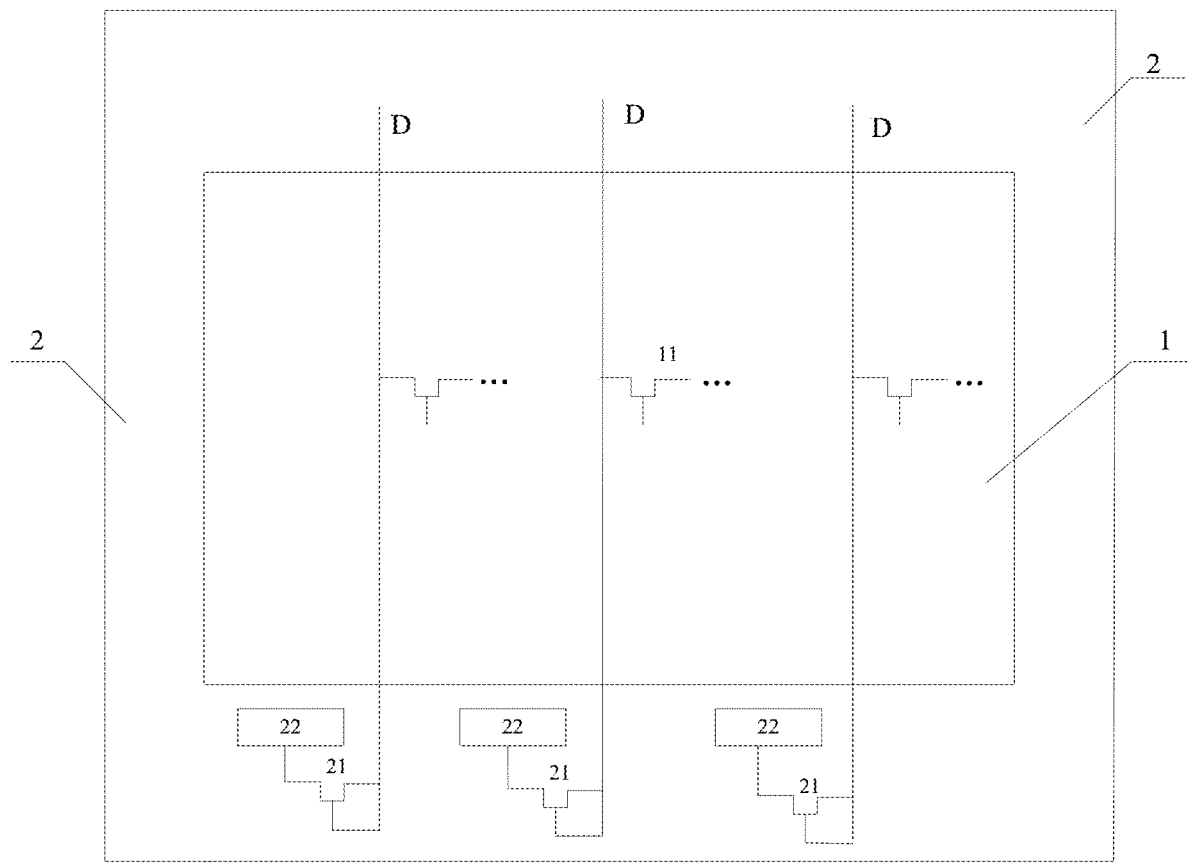
FIG. 2 is a partial schematic view of an array substrate provided by an embodiment of this disclosure.

Referring to FIG. 2, which is a partial schematic view of an array substrate provided by an embodiment of this disclosure. The array substrate comprises an display area 1 and a non-display area 2 outside the display area 1. The non-display area 2 is provided with a first transistor 21 and a first conductive region 22 electrically connected with the first transistor. A control terminal, and one of a source and a drain of the first transistor 21 are both electrically connected to a data line D in the display area 1. The other of the source and the drain of the first transistor is electrically connected to the first conductive region 22.

The first transistor 21 and the first conductive region 22 connected thereto in the non-display area 2 can also be referred to as a virtual pixel unit. In an embodiment, the non-display area of the array substrate comprises a plurality of such virtual pixel units. For the array substrate provided by the embodiments of the disclosure, when static electricity accumulates on the substrate during the rubbing process, the static electricity will be transmitted through the data lines D, hence, the first transistor 21 can receive the static electricity so as to be turned on, thereby leading the static electricity to the first conductive region 22. In this way, the possibility that the static electricity is transmitted to the display area can be lowered or avoided, which may influence or even destroy the switch devices in the display area.

In the process of manufacturing the liquid crystal display panel, the rubbing to the array substrate is generally performed along a direction from a peripheral area to a central area of the array substrate. The roller together with the rubbing cloth passes through the peripheral area of the array substrate firstly, and then moves to the display area of the array substrate. Hence, the static electricity is generally generated in the peripheral area of the array substrate, i.e., the non-display area firstly, and then transmitted to the display area after being accumulated in the non-display area. The first transistor in the array substrate provided in the embodiment of this disclosure can conduct the static electricity to the first conductive region in the non-display area before it reaches the display area of the array substrate.

In an embodiment, the first conductive region is a reference potential region with zero potential (e.g., grounded), thus the static electricity can be released effectively.

In an embodiment, the non-display area 2 comprises a single or a plurality of virtual pixel units, and these virtual pixel units may be located at any side or sides of the display area 1.

The above-mentioned first transistor can be called a first thin film transistor, the thin film transistor 11 for image display in the display area can be referred to as a second thin film transistor, and the threshold voltage of the first thin film transistor is higher than the threshold voltage of the second thin film transistor. In FIG. 2, a second thin film transistor 11 connected with the data line D is schematically shown. It could be understood that in an actual array substrate, each pixel unit can comprise a plurality of second thin film transistors coupled to the data line D for image display. In an embodiment, the static electricity generated in the process of rubbing the array substrate typically has a voltage with a high amplitude, which e.g., is higher than that of a data voltage on the data line for image display. At this time, in the event that the threshold voltage of the first thin film transistor is higher than the threshold voltage of the second thin film transistor, the first thin film transistor will not be turned on when receiving the data voltage, and will be turned on only when receiving the static electricity with a higher voltage. In this way, the first transistor in the non-display area can be prevented from influencing image display in the display area when the liquid crystal display panel is working.

In an embodiment, in order to further avoid influence on the second thin film transistor for image display in the display area, a first current value for turning on the first thin film transistor is greater than or equal to a second current value for breaking down the second thin film transistor. In this way, when the second thin film transistor in the display area works normally (i.e., not being broken down), the first thin film transistor in the non-display area must be in a turned-off state. Only when a relatively strong static electricity is generated, would the first thin film transistor be turned on due to receipt of the relatively strong static electricity. However, the first thin film transistor being turned on would enable the static electricity to be released to the first conductive region, thereby being capable of protecting the second thin film transistor in the display area effectively.

Figure 3:
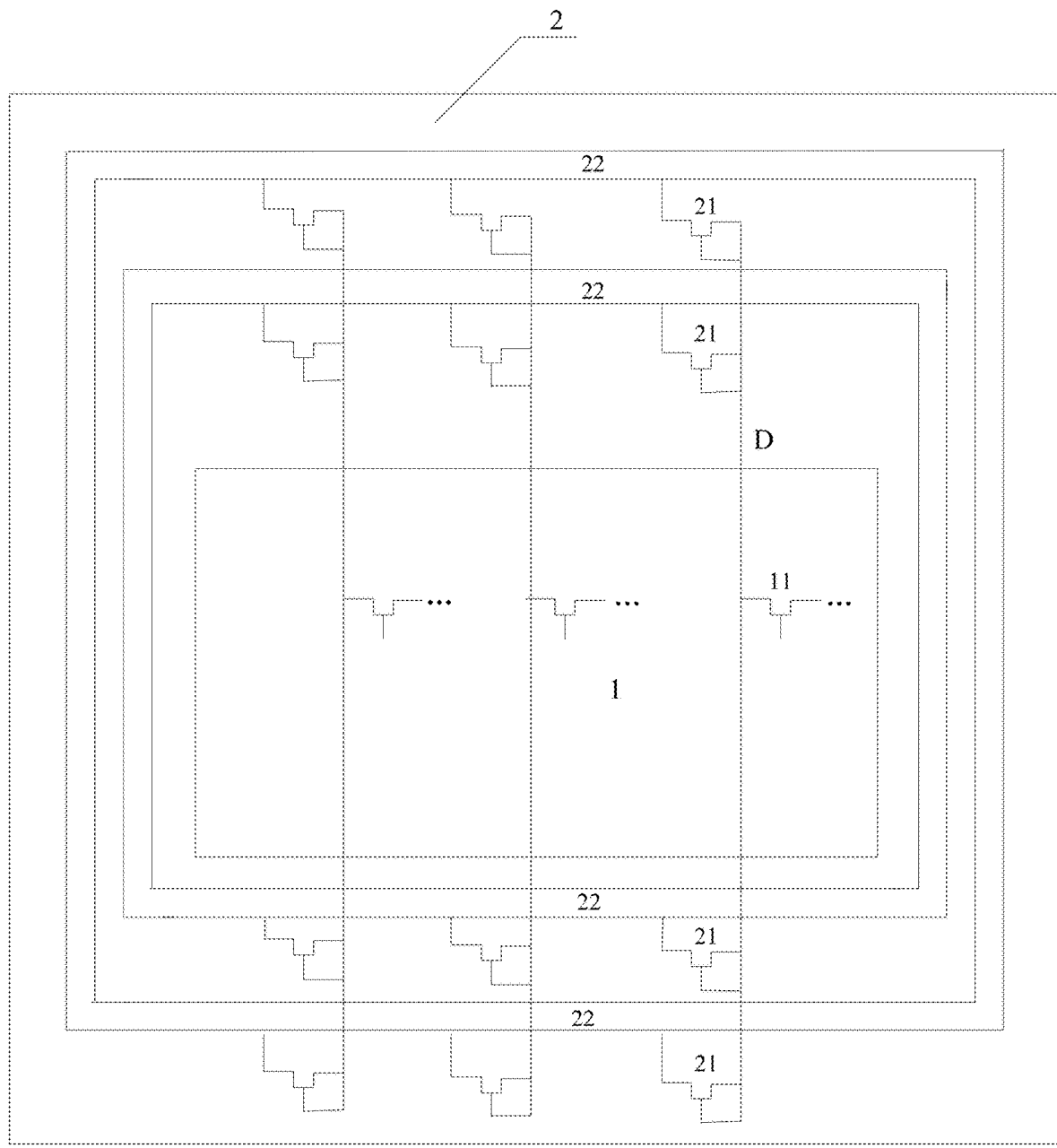
FIG. 3 is a partial schematic view of an array substrate provided by another embodiment of this disclosure.

In an embodiment of this disclosure, the non-display area 2 can be arranged to surround the display area 1. The non-display area 2 is provided with virtual pixel units. Each of the virtual pixel unit includes a first thin film transistor 21 and a first conductive region 22. The first thin film transistor is connected with the data line and the first conductive region respectively. The first conductive regions 22 of the virtual pixel units are connected successively to form a conductive band surrounding the display area 1. For example, FIG. 3 shows that a plurality of first conductive regions 22 in the non-display area below the display area are connected with one another to form a conductive band. That is, in this embodiment, the non-display area 2 surrounds the display area 1, and the non-display area 2 is provided with a plurality of first transistors 21 connected with a plurality of data lines D in one-to-one correspondence respectively. The plurality of first conductive regions 22 electrically connected with the plurality of first transistors 21 are connected successively to form a conductive band surrounding the display area.

Therefore, when the static electricity generated in the rubbing process for the substrate is transmitted along the data lines D, it will be transmitted to the first conductive regions through the first thin film transistors 21. The static electricity on each data line will be led to a first conductive region connected with a corresponding first thin film transistor, thereby leading the static electricity onto the conductive band formed by the first conductive regions, and avoiding transmission of the static electricity to the display area 2, which could have destroyed the second thin film transistor device in the display area.

In an embodiment of this disclosure, a channel breadth length ratio (i.e., a breadth length ratio of the channel) of the first thin film transistor 21 is smaller than that of the second thin film transistor 11. In this way, it is advantageous to realize that the threshold voltage of the first thin transistor is higher than the threshold voltage of the second thin film transistor, thereby enabling the first thin film transistor not to be turned on when receiving the data voltage.

According to another embodiment of this disclosure, the data line extends from the display area 1 to the non-display area 2. Each data line D is electrically connected with at least two first transistors 21. The at least two first transistors are connected in parallel with each other. These first transistors are arranged in the non-display area 2 along an extending direction of the data line D towards the non-display area, as shown in FIG. 3. In this way, the static electricity can be transmitted to a plurality of conductive bands, so as to avoid transmission of the static electricity to the display area, thereby further improving reliability of the array substrate.

Further, in an embodiment, the first conductive regions electrically connected with respective first transistors are connected with each other. In such an embodiment, a larger static electricity releasing area can be provided for each first transistor, which is advantageous for releasing the static electricity more quickly. The first conductive region can be formed using any appropriate conductive material, including but not limited to indium tin oxide (ITO). In the embodiment as shown in FIG. 2 or FIG. 3, a gate and a source of the first transistor 21 are both connected to a data line D, and a drain of the first transistor 21 is connected to the first conductive region 22. In this way, the static electricity on the data line can be transmitted to the gate and the source of the first transistor, the first transistor is therefore in an turned-on state, which in turn leads the static electricity to the first conductive region, so as to avoid transmission of the static electricity to the display area, which could have destroyed the second thin film transistor device in the display area.

Another embodiment of this disclosure further comprises a display device. The display device comprises the array substrate as described in any of the preceding embodiments. The display device can be any devices or components having an image display function, including but not limited to a liquid crystal display panel, a portable mobile device, a navigation device, a television etc.

The embodiments in the description are described in a progressive way. The subsequent embodiments mainly illustrate differences from the former embodiments. The same or similar points between the embodiments may make reference to each other.

Although these embodiments have been described, once the skilled person in the art learns the inventive concept revealed in these embodiments, further modifications and amendments can be made to them. Therefore, the appended claims intend to be interpreted as including the embodiments described and all modifications and amendments that fall within the scopes of the claims.

Finally, it should be further noted that in this text, the relationship terms such as "first" and "second" and the like are only used for distinguishing one entity or operation from another entity or operation, while not necessarily requiring or implying presence of any such actual relationship or order between these entities or operations. Moreover, the term "comprise", "include" or any other variants thereof intends to cover nonexclusive inclusion, so a process, a method, an article or a terminal device that includes a series of elements not only includes those elements, but also includes other elements not listed explicitly, or further includes elements inherent for the process, method, article or terminal device. Unless otherwise specified, the element defined by the wording "including . . . " does not exclude presence of a further same element in the process, method, article or terminal device that includes the element.

What are stated above are only embodiments of this disclosure, however, the scope of the present application is not so limited. Any modifications or replacements that can be easily conceived by the skilled person familiar with the present technical field within the scope disclosed herein should all fall into the scope of the application. Therefore, the scope of the present application shall be subject to the scopes of the claims.

The invention claimed is:

1. An array substrate, comprising:
a display area; and
a non-display area outside the display area,
wherein the non-display area comprises a first thin film transistor and a first conductive region electrically connected to the first thin film transistor,
wherein a control terminal, and one of a source or a drain of the first thin film transistor are electrically connected to a data line in the display area,
wherein another of the source or the drain of the first thin film transistor is electrically connected to the first conductive region,
wherein the display area comprises a second thin film transistor-configured to display an image, and a first threshold voltage of the first thin film transistor is higher than a second threshold voltage of the second thin film transistor,
wherein the non-display area surrounds the display area, the non-display area comprises a plurality of first thin film transistors comprising the first thin film transistor,
wherein the plurality of first thin film transistors are electrically connected with respective ones of a plurality of data lines comprising the data line in one-to-one correspondence respectively, and
wherein a plurality of first conductive regions comprising the first conductive region are electrically connected with respective ones of the plurality of first thin film transistors and are connected successively to form a conductive band around the display area.

2. The array substrate according to claim 1, wherein a first current value for turning on the first thin film transistor is greater than or equal to a second current value for breaking down the second thin film transistor.

3. The array substrate according to claim 1, wherein a first width-to-length ratio of a first channel of the first thin film transistor is less than a second width-to-length ratio of a second channel of the second thin film transistor.

4. The array substrate according to claim 1,
wherein the data line extends from the display area to the non-display area,
wherein each data line of a plurality of data lines comprising the data line is electrically connected with at least two of a plurality of first thin film transistors comprising the first thin film transistor,
wherein the at least two of the plurality of first thin film transistors are connected in parallel with each other, and
wherein the at least two of the plurality of first thin film transistors are arranged in the non-display area successively along an extending direction of the data line towards the non-display area.

5. The array substrate according to claim 1, wherein a material of the first conductive region comprises indium tin oxide (ITO).

6. A display device comprising an array substrate, the array substrate comprising:
a display area; and
a non-display area outside the display area,
wherein the non-display area comprises a first thin film transistor and a first conductive region electrically connected to the first thin film transistor,
wherein a control terminal, and one of a source or a drain of the first thin film transistor are electrically connected to a data line in the display area,
wherein another of the source or the drain of the first thin film transistor is electrically connected to the first conductive region,
wherein the display area comprises a second thin film transistor-configured to display an image, and a first threshold voltage of the first thin film transistor is higher than a second threshold voltage of the second thin film transistor,
wherein the non-display area surrounds the display area, the non-display area comprises a plurality of first thin film transistors comprising the first thin film transistor,
wherein the plurality of first thin film transistors are electrically connected with respective ones of a plurality of data lines comprising the data line in one-to-one correspondence respectively, and
wherein a plurality of first conductive regions comprising the first conductive region are electrically connected with respective ones of the plurality of first thin film transistors and are connected successively to form a conductive band around the display area.

7. The display device according to claim 6, wherein a first current value for turning on the first thin film transistor is greater than or equal to a second current value for breaking down the second thin film transistor.

8. The display device according to claim 6, wherein a first width-to-length ratio of a first channel the first thin film transistor is less than a second width-to-length ratio of a second channel of the second thin film transistor.

9. The display device according to claim 6,
wherein the data line extends from the display area to the non-display area, wherein each data line of a plurality of data lines comprising the data line is electrically connected with at least two of a plurality of first thin film transistors comprising the first thin film transistor, wherein the at least two of the plurality of first thin film transistors are connected in parallel with each other, and wherein the at least two of the plurality of first thin film transistors are arranged in the non-display area successively along an extending direction of the data line towards the non-display area.

10. The display device according to claim 6, wherein a material of the first conductive region comprises indium tin oxide (ITO).

11. A display device comprising:
a display area; and
a non-display area outside the display area,
wherein the non-display area comprises a first thin film transistor and a first conductive region electrically connected to the first thin film transistor,
wherein a control terminal, and one of a source or a drain of the first thin film transistor are electrically connected to a data line in the display area, wherein another of the source or the drain of the first thin film transistor is electrically connected to the first conductive region, wherein the display area comprises a second thin film transistor-configured to display an image, and a first threshold voltage of the first thin film transistor is higher than a second threshold voltage of the second thin film transistor, wherein the non-display area surrounds the display area, the non-display area comprises a plurality of first thin film transistors comprising the first thin film transistor, wherein the plurality of first thin film transistors are electrically connected with respective ones of a plurality of data lines comprising the data line in one-to-one correspondence respectively, and wherein a plurality of first conductive regions comprising the first conductive region are electrically connected with respective ones of the plurality of first thin film transistors and are connected successively to form a conductive band around the display area.

* * * * *